United States Patent

Hambleton

[15] 3,651,562

[45] Mar. 28, 1972

[54] METHOD OF BONDING SILICON TO COPPER

[72] Inventor: Kenneth G. Hambleton, Baldock, England

[73] Assignee: National Research Development Corporation, London, England

[22] Filed: Nov. 25, 1969

[21] Appl. No.: 879,895

[30] Foreign Application Priority Data

Nov. 30, 1968 Great Britain ......................56,981/68

[52] U.S. Cl. ................................29/473.1, 29/492, 29/498, 29/504, 29/590, 29/626

[51] Int. Cl. ........................................................B23k 31/02

[58] Field of Search ................29/473.1, 589, 590, 504, 626, 29/492, 498, 488

[56] References Cited

UNITED STATES PATENTS

| | | | |
|---|---|---|---|
| 3,006,067 | 10/1961 | Anderson et al. | 29/473.1 X |
| 3,037,180 | 5/1962 | Linz, Jr. | 29/589 UX |
| 3,128,545 | 4/1964 | Cooper | 29/590 UX |
| 3,225,438 | 12/1965 | Cooper | 29/492 X |
| 3,296,692 | 1/1967 | Griffin | 29/498 X |
| 3,369,290 | 2/1968 | Mayer et al. | 29/590 X |
| 3,432,913 | 3/1969 | Bronnes et al. | 29/473.1 X |
| 3,447,238 | 6/1969 | Heynes et al. | 29/590 |
| 3,454,473 | 7/1969 | Minami et al. | 29/590 X |

OTHER PUBLICATIONS

Conti, R. J., " Thermocompression Joining Technique for Electronic Devices and Interconnects" Metals Engineering Quarterly, Feb., 1966, pp. 29–35.

*Primary Examiner*—Charlie T. Moon
*Assistant Examiner*—Ronald J. Shore
*Attorney*—Cushman, Darby and Cushman

[57] ABSTRACT

The present invention concerns a method of mounting a silicon semiconductor device onto a copper heat sink in which a flash of titanium is first evaporated onto the contacting surface of the semiconductor device followed by coating the titanium and the contacting surface of the heat sink with either silver or gold and bonding the semiconductor device and the heat sink together by thermo-compression.

9 Claims, No Drawings

METHOD OF BONDING SILICON TO COPPER

The present invention is concerned with the problem of bonding silicon to copper.

Many semiconductor devices operate at large power densities and must be mounted so that the heat generated in the junction region can be removed efficiently. In some cases the design of the heat sink is one of the most important aspects of the device. This is particularly true for high power C.W. microwave avalanche generators where input power densities often exceed $10^8$ watts/cm.$^3$ at the junction. In laboratory experiments the highest powers have been obtained using diamond heat sinks, but the diamond must be carefully selected and processed and all semiconductor devices commercially available at present are mounted on copper. Where the semiconductor material is silicon the difficulty of bonding the silicon to the copper stems from the very large difference in the linear expansion coefficients of silicon and copper, namely $4.2 . 10^{-6}$/° C. for silicon and $17.10^{-6}$/° C. for copper. This means that the normal methods of bonding which involve temperature differences of several hundred degrees cannot be used. Eutectic bonding which involves heating the silicon in contact with gold-plated metal to the gold-silicon eutectic temperature of 370° C. works best with a metal such as molybdenum which has a similar expansion coefficient to silicon ($6 \times 10^{-6}$/° C). In practice small areas of silicon can be bonded to copper by this technique, but above about 1 or 2 mm. diameter the differential contraction on cooling causes severe cracking of the silicon due to local concentrations of stress at the edges or at defects within the material. The problem should be less severe if low melting point solders are used, but in general alloys are produced with the silicon which are very brittle and the bond is mechanically weak. There are also two other disadvantages. Firstly the alloy region will probably be a poor thermal conductor, and secondly the temperature may rise above the melting point of the solder during the high power operation of the device, which will obviously lead to early failure.

If the silicon as well as the metal is coated with gold, thermo-compression bonding can be used. This involves a combination of pressure and temperature sufficient to create good mechanical adhesion between the two layers of gold, which is an ideal material for this type of bond. Normally temperatures just below the gold-silicon eutectic temperature are used, but in the present case of large areas of silicon on copper the temperature change would be too severe, and it was decided to investigate bonding at much lower temperatures by using much higher pressures than have previously been employed.

It was necessary to establish the correct combination of temperature pressure, time, and gold thickness, and it was found experimentally that it was possible to bond at a temperature of 150° C. without the silicon cracking on cooling by using a pressure of about $5.10^4$ p.s.i.

Discs of silicon up to one-half inch in diameter have been bonded successfully, and the process is extremely reliable and reproducible. Metallographic sections have shown that the bond is uniform over the whole area, and in fact it is impossible to distinguish the two separate layers of gold. In the initial experiments it was found that the weakest part of the bond was between the gold and the silicon, and it was necessary to evaporate a thin flash of titanium on to the silicon surface before the gold. This improved the adhesion to such an extent that attempts to rupture the bond usually ended with the fracture of the silicon which is the most brittle of the materials present.

This method of low temperature compression bonding is free from the criticisms applied to low temperature soldering. Only pure metals are involved so there are no brittle alloy regions and the thermal conductivity through the bond will be high. In operation the temperature can rise to the gold-silicon eutectic temperature (370° C.) before any melting can occur. Even above this temperature reaction between the gold and the silicon should be prevented by the titanium layer which can be made thicker if necessary. Alternatively, it would be possible to use a layer of silver on the silicon or the heat sink or both instead of the gold, since the silver-silicon eutectic forms at a higher temperature (830° C.).

No thermal expansion problems arise in operating silicon semiconductor junctions bonded by this method to heat sinks above the bonding temperature of 150° C., because to make the devices the silicon has usually been etched into fairly small islands and so the edge stresses due to differential expansion do not build up to very high values. Also the silicon will inevitably be at a higher temperature than the copper and this will help to compensate for the large difference in expansion coefficients. In practice some of these devices have operated with junction temperatures greater than 200° C. and there has been no degradation of the thermo-compression bond.

As a slight digression it is worth considering the application of the above techniques to the provision of a good heat sink on more general types of devices and even on silicon integrated circuits where the very high component densities often lead to a heating problem. The obvious limitation of the gold thermo-compression bonding previously described is that all the devices are electrically connected together. However, preliminary experiments have shown that equally good bonding can be obtained with an oxidized silicon surface and this will not interfere with the efficiency of the copper heat sink whilst providing electrical isolation. The simplest approach would be to fabricate the devices or circuits normally but without cutting contact holes or metallizing. A layer of either thermal or pyrolytic oxide would then be grown and the slice bonded face-down on to the gold-plated copper heat sink by the method previously described. The silicon would then be polished sufficiently thin to expose the junction areas from underneath and the metal contact patterns evaporated on this side, after growing an isolating layer of anodic oxide. If pyrolytic oxide were used on the top surface it could be deposited after one layer of metallizing as the soft gold-plating on the copper would easily take up the small differences in thickness. This offers the flexibility of an extra layer of interconnections, and would also allow the gate oxide and metal of MOS devices to be completed in the normal manner before the slice is bonded to the copper. With pyrolytic oxide the restriction to silicon is removed and it would be possible to use the techniques with other semiconductors such as GaAs or Ge.

We claim:

1. A method of mounting a slice of semiconductor material onto a copper heat sink, including the steps of:
   a. evaporating a flash of titanium onto the surface of the slice of semiconductor material which is to be presented toward the heat sink;
   b. coating said titanium with a metal selected from the group consisting of silver and gold;
   c. coating the surface of the copper heat sink which is to be presented toward the semiconductor device with a metal selected from the group consisting of silver and gold; and
   d. bonding the semiconductor device to the copper heat sink by contacting the two metal coated surfaces with one another and thermo-compressing them together at a temperature in the region of 150° C. and a pressure of about $5 \times 10^4$ p.s.i.

2. The method of claim 1 wherein the area of the bond corresponds to a diameter in the range of 1 millimeter to one-half inch.

3. The method of claim 1 wherein the area of the bond corresponds to a diameter in the range of 2 millimeters to one-half inch.

4. The method of claim 1 wherein the slice of semiconductor material is one which has integrated circuit means formed therein, and wherein, before conducting step (a):
   i. oxidizing the surface of the slice of semiconductor material which is to be flashed with titanium; then conducting steps (a), (b), (c) and (d); then
   e. polishing the opposite surface of said slice to expose junction areas of said integrated circuit means;

f. growing an isolating layer of anodic oxide on the polished surface; and g. evaporating metallic contact patterns onto the anodic oxide-covered surface.

5. The method of claim 4 wherein the slice of semiconductor material comprises silicon and the oxidizing conducted in step (i) is a thermal oxidation, producing silica.

6. The method of claim 4 wherein the slice of semiconductor material comprises one of silicon, gallium arsenide and germanium, and the oxidizing conducted in step (i) is a pyrolytic oxidation.

7. The method of claim 6 further comprising, before conducting steps (i) and (a):

evaporating metallic contact patterns onto the surface of the slice of semiconductor material which is to be presented toward the heat sink.

8. The method of claim 4 wherein the area of the bond corresponds to a diameter in the range of 1 millimeter to one-half inch.

9. The method of claim 4 wherein the area of the bond corresponds to a diameter in the range of two millimeters to one-half inch.

* * * * *